United States Patent [19]

Teramoto

[11] Patent Number: 5,722,441
[45] Date of Patent: Mar. 3, 1998

[54] ELECTRONIC DEVICE PROCESS APPARATUS

[75] Inventor: Masashi Teramoto, Tokyo, Japan

[73] Assignees: Tokyo Electron Limited; Tokyo Electron FE Limited, both of Tokyo, Japan

[21] Appl. No.: 753,032

[22] Filed: Nov. 19, 1996

Related U.S. Application Data

[63] Continuation of Ser. No. 199,573, Feb. 22, 1994, abandoned.

[30] Foreign Application Priority Data

Feb. 22, 1993 [JP] Japan .................. 5-056424

[51] Int. Cl.$^6$ .................................. B08B 3/02
[52] U.S. Cl. ............... 134/56 R; 134/57 R; 134/113; 134/95.3; 134/902; 134/111
[58] Field of Search ................ 134/113, 56 R, 134/57 R, 58 R, 95.3, 902, 111, 100.1, 99.2; 137/93, 88, 91; 68/12.18; 216/86; 156/345 MC

[56] References Cited

U.S. PATENT DOCUMENTS

| | | | |
|---|---|---|---|
| 2,760,769 | 8/1956 | Onstad | 137/88 |
| 2,913,893 | 11/1959 | Mathews et al. | 137/88 |
| 3,276,458 | 10/1966 | Iversen et al. | |
| 3,319,637 | 5/1967 | Gore et al. | |
| 3,376,883 | 4/1968 | Douty et al. | 137/88 |
| 3,767,483 | 10/1973 | Tokuyama et al. | |
| 3,815,620 | 6/1974 | Dziomba et al. | 137/88 |
| 3,880,685 | 4/1975 | Rehm et al. | 134/902 X |
| 3,964,956 | 6/1976 | Snyder | 134/57 R X |
| 3,973,572 | 8/1976 | Brous | 134/113 |
| 4,091,834 | 5/1978 | Frigato | 137/93 |
| 4,190,481 | 2/1980 | Goffredo | 134/51 R X |
| 4,306,581 | 12/1981 | Alandt | 137/93 |
| 4,315,518 | 2/1982 | Sawyer | 137/93 |
| 4,639,137 | 1/1987 | Hazan et al. | 134/113 |
| 4,731,154 | 3/1988 | Hazlitt et al. | 134/113 |
| 4,733,798 | 3/1988 | Brady et al. | 134/113 |
| 4,796,042 | 1/1989 | Mappin et al. | 134/113 X |
| 4,817,652 | 4/1989 | Liu et al. | |
| 4,838,476 | 6/1989 | Rahn | 134/902 |
| 4,855,023 | 8/1989 | Clark et al. | 134/902 |
| 4,867,193 | 9/1989 | Hayashi et al. | 137/93 |
| 5,069,235 | 12/1991 | Vetta et al. | 134/113 |
| 5,137,694 | 8/1992 | Copeland et al. | 137/93 X |
| 5,158,100 | 10/1992 | Tanaka et al. | |
| 5,242,468 | 9/1993 | Clark et al. | 134/902 |
| 5,275,184 | 1/1994 | Nishizawa et al. | |
| 5,302,311 | 4/1994 | Sugihara et al. | |
| 5,308,400 | 5/1994 | Chen | |
| 5,364,510 | 11/1994 | Carpio | |
| 5,396,178 | 3/1995 | Rybarski | |

FOREIGN PATENT DOCUMENTS

| | | |
|---|---|---|
| 2-243784 | 9/1990 | Japan |
| 3-32419 | 3/1991 | Japan |

*Primary Examiner*—Frankie L. Stinson
*Attorney, Agent, or Firm*—Oblon, Spivak, McClelland, Maier & Neustadt, P.C.

[57] ABSTRACT

A process apparatus for processing semiconductor wafers. It includes a process vessel in which process solution is contained. In the process solution, the wafers are immersed and processed. A supply pipe extends from the process vessel to solution storing vessels. Component solutions are stored in the component solution storing vessels and supplied from them to the process vessel to keep the concentration of each component in process solution. A supply pump is attached to the supply pipe. Valves for adjusting the amount of each component supplied are attached to the supply pipe. The adjusting valves are electrically connected to a CPU. Data representing that concentration of each component in process solution which changes with passage of time are previously stored in the CPU. The CPU controls the adjusting valves on the basis of the data to supply component solutions into the process vessel so as to meet any change in the concentration of each component in process solution in the process vessel. The concentration of each component in process solution can be thus kept to be a predetermined value. This enables the wafers in every batch to be uniformly washed.

40 Claims, 5 Drawing Sheets

ELECTRONIC DEVICE PROCESS APPARATUS

This application is a Continuation of application Ser. No. 08/199,573, filed on Feb. 22, 1994, now abandoned.

BACKGROUND OF THE INVENTION

1. Field of the Invention

The present invention relates to an apparatus for processing matters such as semiconductor wafers by process solutions. More particularly, it relates to a process apparatus for applying washing process to surfaces of the semiconductor wafers.

2. Description of the Related Art

A washing system is usually used to remove impurities such as particles from the surface of each semiconductor wafer in the course of manufacturing semiconductor devices. In the case of this washing system, ammonia, water, hydrofluoric acid, sulfuric acid and hydrochloric acid processes are successively applied to the wafers to wash and clean the surface of each wafer.

The conventional washing system includes process chambers. In the chamber, various process vessels are housed. The process vessels are used for applying ammonia, water, hydrofluoric acid and other processes to the wafers. The process vessels are arranged in a predetermined manner (e.g., a straight line). The wafers are carried into and out of each process vessel by carrier means. They are immersed into process solution in each process vessel. They are thus successively processed with the various processes in the process vessels and finally made clean.

Figure 1:
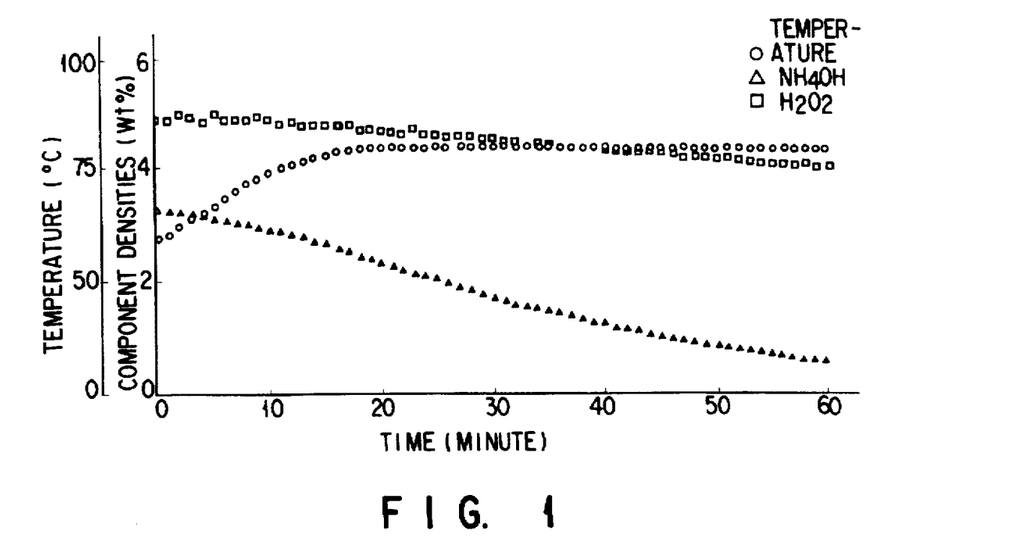
FIG. 1 is a graph showing how the concentration of each component in process solution changes with passage of time.

In the case of this conventional washing system, the concentration of each component in process solution in each process vessel changes with passage of time. The ammonia process, for example, is carried out using a mixture (which will be hereinafter referred to as APM) of ammonia, hydrogen peroxide and pure water and at a temperature range of 60° C.–80° C. The concentration of ammonia which is one of components contained in APM tends to decrease with passage of time, as shown in FIG. 1. This is because ammonia, high in volatility, is likely to volatilize in atmosphere in the process chamber. In addition, the process chamber usually includes a fan attached to its ceiling and a discharging duct attached to its lower part. Clean air flowing from above to below in it is created by the fan and the air is discharged from the discharging duct, thereby preventing the wafers from being contaminated. The process chamber is thus kept under such an atmosphere that allows ammonia to more easily volatilize.

When the concentration of ammonia in the APM gradually decreases in this manner, the wafers in a batch which have been processed just after the start of washing process are different in their cleanliness from those in another batch which will be processed after the lapse of a certain time period and in process solution in which the concentration of ammonia has lowered to some extent, even though the wafers in these two batches are immersed in process solution for a same time. The cleanliness of the wafers thus washed is different every batch. This problem is caused in other process solutions such as hydrofluoric acid (DHF), sulfuric acid (SPM) and hydrochloric acid (HPM) solutions.

In order to solve the problem, conventionally, all of process solution in the process vessel is changed to new one every time that a certain time (e.g., 10 minutes) passes or the washing process is repeated predetermined times.

In these conventional manners of making all of process solution new, however, a large amount of effort and working time is needed to thereby lower the efficiency of washing process. In addition, some part of process solution is wasted and it is not economical accordingly. Further, when a large amount of process solution is frequently exhausted outside, harmful components in the process solution thus exhausted will add bad influences to circumstances. To prevent this, however, a large amount of time and labor will be needed for the process making the process solution to harmless.

In order to solve the above-mentioned problems, it is supposed to make a part of process solution in the process vessel new every lapse of a certain time period or every time the washing process is repeated predetermined times. According to this manner, the time at which all of process solution is changed new one can be postponed till later. It is however difficult to determine the timing at which the new process solution is added into the process vessel. The preliminary test must be repeated to determine this timing. It is also difficult in this manner to keep certain the concentration of each component in process solution. This is because the concentration of each component increases temporarily when a part of process solution in the process vessel is added into the vessel. In the case of this manner, therefore, the washing process applied to the wafers becomes different every batch. It cannot be made stable accordingly.

SUMMARY OF THE INVENTION

The object of the present invention is therefore to provide a process apparatus capable of keeping certain the concentration of process solution in a process vessel and also making process accuracy and efficiency higher.

This object of the present invention can be achieved by a process apparatus comprising a process vessel in which a process solution is contained, the process solution is used for processing a subjecting matter with being immersed into it; a means for supplying the process solution into the process vessel; a means for adjusting the amount of the process solution supplied from the process solution supply means; and a means for controlling the adjusting means; wherein the control means controls the adjusting means to supply the process solution into the process vessel so as to meet any change in the concentration of each component in the process solution, so that the concentration of the component can be kept to be a predetermined value in the process solution.

Also, this objects of the present invention can be achieved by a process apparatus comprising a process vessel in which a process solution is contained, the process solution is used for processing a subjecting matter with being immersed into it; a means for supplying the process solution to the process vessel; a passage through which a part of the process solution is discharged from the process vessel; a means for adjusting the amount of the process solution supplied into the process vessel by the process solution supply means; a means for controlling the adjusting means; and a means for detecting the density of each component in the process solution, the means is attached to the discharge passage; wherein the control means continuously controls the adjusting means, responsive to detection signal applied from the detecting means, to supply the process solution into the process vessel so as to meet any change in the concentration of each component in the process solution, so that the concentration of the component in the process solution can be kept to be a predetermined value.

Also, this objects of the present invention can be achieved by a method of processing a subjecting matter while immersing them in a process solution in a process vessel comprising supplying the process solution into the process vessel by control means, continuously adjusting the amount of each component in the process solution to meet any change in the component concentration, and keeping the component concentration in the process solution to be a predetermined value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A case where a washing apparatus according to the present invention is used to wash semiconductor wafers will be described with reference to the accompanying drawings.

Figure 2:
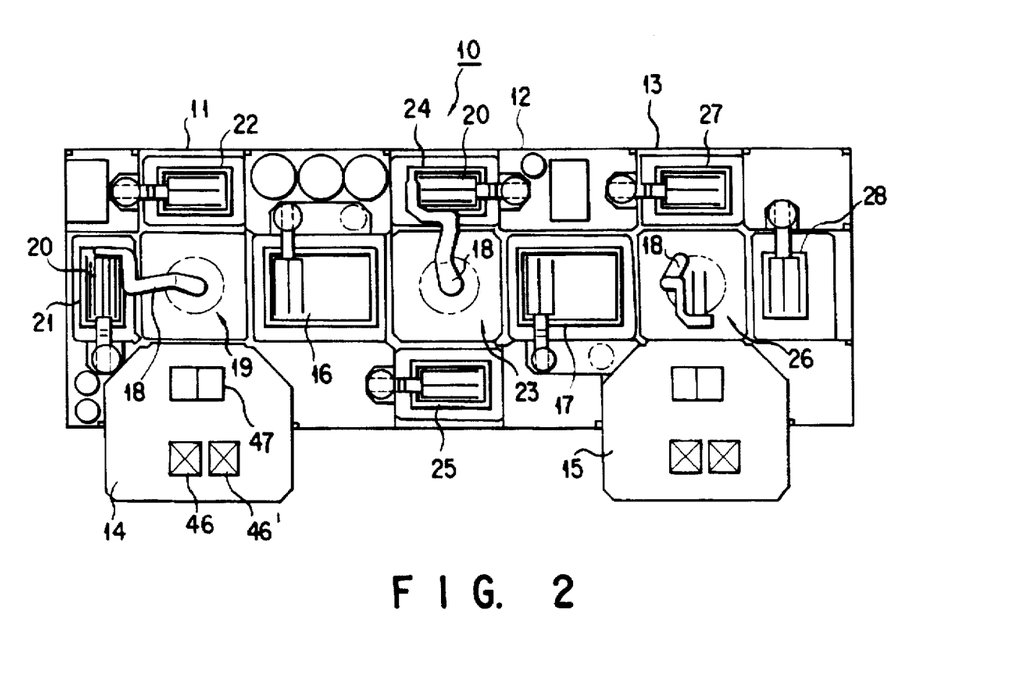
FIG. 2 is a plan view showing the whole of a washing system to which the present invention is applied.

As shown in FIG. 2, a washing system 10 is a combination of three washing units 11, 12 and 13. The three washing units 11, 12 and 13 are arranged like a straight line in this order. The first unit 11 is provided on that side of the washing system 10 where semiconductor wafers W are received into the washing system 10. It includes a loader 14 provided with a stage.

The third washing unit 13 is provided on that side of the washing system 10 where the semiconductor wafers W are taken out from the washing system 10. It includes an unloader 15 provided with a stage.

An into-water loader 16 is arranged between the first 11 and the second washing unit 12. Another into-water loader 17 is also arranged between the second 12 and the third washing unit 13. The first into-water loader 16 belongs to the first washing unit 11 and the second into-water loader 17 to the second washing unit 12.

A carrier means 19 provided with a multi-joint arm 18 is located at the center of the first washing unit 11. The base of the carrier means 19 is connected to the drive shaft of a stepping motor (not shown) and the arm 18 is arranged rotatable round the base of the carrier means 19 and extensible from the base thereof. A wafer fork 20 is supported by the arm 18.

Two washing vessels 21 and 22 are located adjacent to the carrier means 19. In the case of this example, ammonia solution is contained, as process solution, in the washing vessel 21 and pure water is contained, as washing liquid, in the washing vessel 22. The pure water washing vessel 22 is used for the so-called Quick Dump Rinse to wash out ammonia liquid on the semiconductor wafers W.

A carrier means 23, same as the above-mentioned one 19, is also located at the center of the second washing unit 12.

Two washing vessels 24 and 25 are located adjacent to the carrier means 23. As the result, the two washing units 24, 25 and the two into-water loaders 16, 17 are located enclosing the center portion of the second washing unit 12.

In the case of this example, a mixture (which will be referred to as DHF) of hydrofluoric acid (HF), hydrogen peroxide and pure water is contained, as process solution, in the vessel 24 and water is contained, as washing liquid, in the vessel 25. The water washing vessel 25 is used as the so-called washing water overflow vessel to wash out DHF on the semiconductor wafers W.

A carrier means 26 is also located at the center of the third washing unit 26 and it is same as those 19 and 23 as described above.

A washing vessel 27 in which final rinsing is carried out is located adjacent to the carrier means 26 and in opposite to an unloader 15 of the carrier means 26. A drying vessel 28 in which drying is carried out with isopropyl alcohol (IPA) is also located adjacent to the carrier means 26 and to the right of the unloader 15 thereof.

Figure 3:
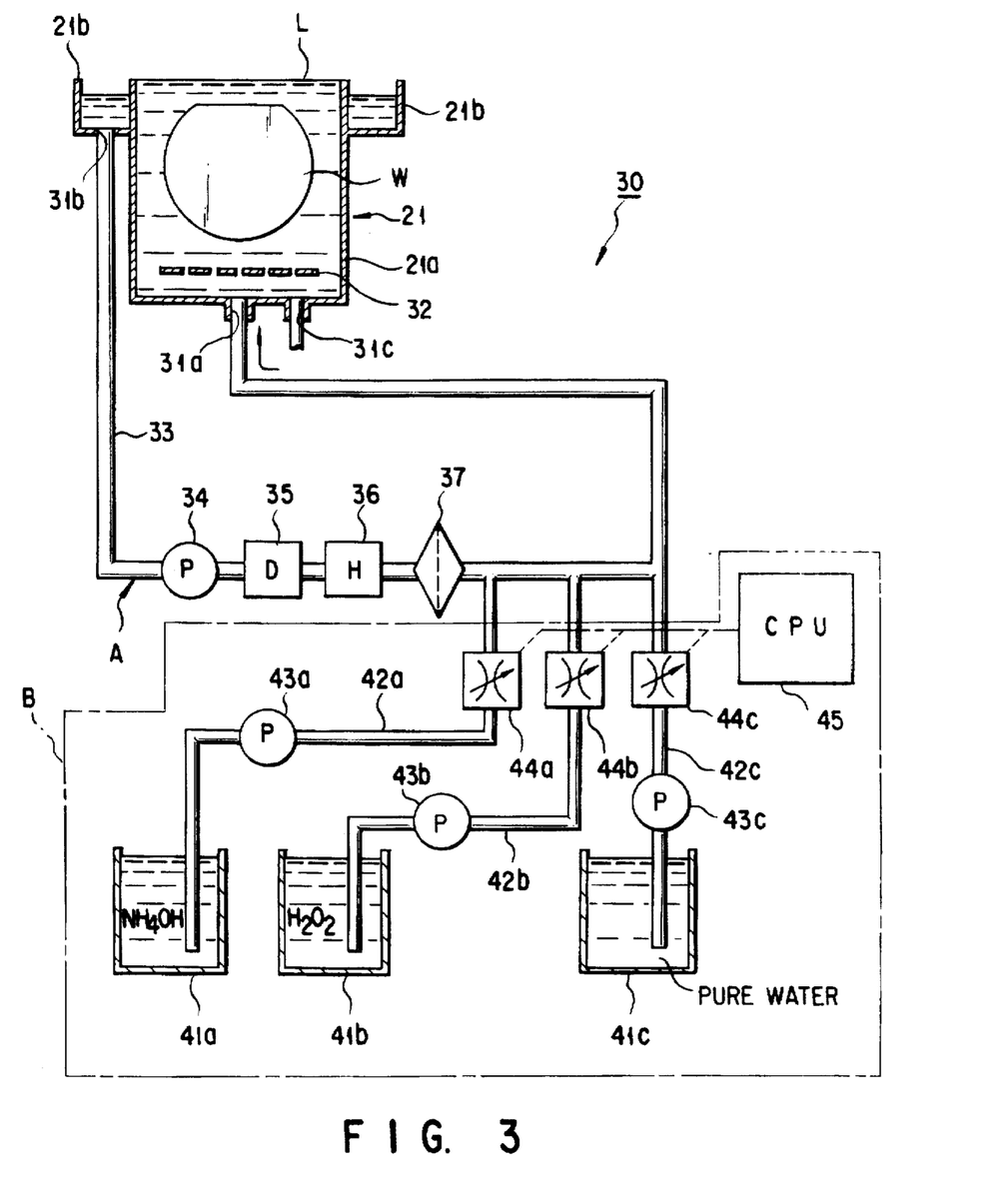
FIG. 3 is schematic illustration showing the main portion of the washing process apparatus according to a first embodiment of the present invention.

The washing vessel 21 of the above-described washing system 10 in which APM is used as process solution has such a process solution supply system 30 as shown in FIG. 3. More specifically, process solution supply opening 31a and discharge openings 31c are formed in the bottom of a vessel main body 21a of this washing vessel 21. An overflow trough 21b encloses the open top of the vessel main body 21a, extending along the outer face thereof. A process solution collecting opening 31b is formed in the bottom of the overflow trough 21b. Process solution L is contained in this washing vessel 21 and plural sheets, such as fifty sheets, of wafers W which are supported by a wafer fork (not shown) are carried into the vessel 21 and immersed in process solution L in it. Arranged in the vessel main body 21a adjacent to the bottom thereof is a straightening plate 32 to uniformly apply process solution L, which is supplied through the supply opening 31a, to the wafers W.

One end of a circulation pipe 33 is connected to the process solution collecting opening 31b in the bottom of the overflow trough 21b. The other end thereof is connected to the process solution supply opening 31a. A circulation pump 34, a damper 35, a heat exchanger 36 and a filter 37 are attached on the mid way of the circulation pipe 33 in this order when viewed from the process solution collecting opening 31b. In the case of this circulation line A thus formed, process solution L overflowed from the open top of the vessel main body 21 and received in the overflow trough 21b is circulated from the collecting opening 31b to the supply opening 31a through the circulation pipe 33 by the circulation pump 34. In this time, process solution L is controlled to an appropriate temperature (for example, 50° C.) by the heat exchanger 36 and particles are removed from process solution L by the filter 37 in this while. The pulsing of process solution L caused by the circulation pump 34 is reduced by the damper 35.

Process solution supply lines B are connected to the circulation pipe 33 of the circulation line A downstream the filter 37 thereof to supply new process solution to the pipe 33. The lines B include component solution vessels 41a, 41b and 41c in which component solution such as aqueous ammonia, hydrogen peroxide aqueous solution and pure water are contained, respectively. These component solutions are used for supplying the components of APM. Supply pipes 42a, 42b and 42c extend from these vessels 41a, 41b and 41c to the circulation pipe 33 and they include supply pumps 43a, 43b, 43c and flow rate control valves 44a, 44b, 44c. The flow rate control valves 44a, 44b and 44c are electrically connected to a CPU 45.

In the case of the above-described process solution supply system 30, the supply of process solution L is carried out as follows:

For example, constants are stored in the CPU 45. They are previously calculated from data representing those concentration changes of ammonia and hydrogen peroxide in process solution L which are measured by preliminary tests. In short, they are determined on the basis of these measured data and according to one of various control operational manners. The control operational manners include on/off, proportional, integral, PID and other actions. The PID action, for example, is a combination of proportional, integral and derivative actions. Relating to a reference value which denotes the concentration of each component contained and which is asked to be kept certain, three control constants of the proportional, integral and derivative actions are obtained from the measured data which change with passage of time. And one of these three constants which is the nearest to the value representing the control characteristic asked is selected. The constants thus calculated are manually inputted into memories in the CPU 45 by the operator or automatically inputted into them according to a recipe. Responsive to the constants stored, the CPU 45 applies control signal to the valves 44a–44c to control the amount of each component supplied.

According to the process solution supply system 30, therefore, ammonia and hydrogen peroxide in process solution L which gradually reduce with passage of time can be continuously added to make their concentrations in process solution L certain.

Although the valves 44a–44c have been used to control the amounts of components supplied, mass flow controllers may be used instead. For example, the mass flow controller having CPU, such as AERA LIQUID MASS FLOW CONTROLLER produced by Japan Tylan, can be used preferably. Also, the discharging amounts of supply pumps 43a–43c may be controlled.

Although the process solution supply system 30 has been applied to the APM-contained process vessel, it can be also applied to those process vessels, in which DHF including hydrofluoric acid and the other process solutions are contained, for controlling the concentration of components in the process solution.

In the washing system 10 as described above, the washing process is carried out as follows: Two carriers 46 and 46' in each of which 25 sheets of wafers W are housed are carried to the loader 14. An orientation flat aligner 47 of the loader 14 is made operative to align orientation flats of the wafers W in the carriers 46 and 46'. Pusher rods (not shown) are driven to push the wafers W upward out of the carriers 46 and 46'. The multi-joint arm 18 of the carrier means 19 is rotated in the horizontal direction and extended to the loader 14 to position its front end fork 20 under the pusher rods. The pusher rods are lowered and the wafers W are thus mounted and positioned on the fork 20. While holding the wafers W seated on the fork 20, the multi-joint arm 18 is rotated and extended to position the wafers W above the open top of the process vessel 21. The wafers W are then immersed into process solution L in the process vessel 21. Ammonia washing is thus applied to the wafers W.

When the ammonia-washing is finished in the process vessel 21, the wafers W are carried to the next process vessel 22 and water-washed in it. When the water-washing is finished, they are carried from the first unit 11 to the second one 12 by the into-water loader 16. They are then carried to the DHF-contained vessel 24 by the multi-joint arm 18 of the carrier means 23 in the second unit 12. This carrying of the wafers W is same as seen in the case of the first unit 11 as described above. They are subjected to hydrofluoric acid washing in the process vessel 24. They are then carried from the process vessel 24 to the one 25 where overflowing water washing is applied to them.

The wafers W which have been washed in the second unit 12 are carried from the second unit 12 to the third one 13 by the into-water loader 17. They are then carried into the process vessel 27 by the multi-joint arm 18 of the carrier means 26 in the third unit 13. This carrying of the wafers W is same as seen in the case of the first unit 11 as described above. The final rinse of water is applied to the wafers W in the process vessel 27 and the wafers W thus rinsed is then carried into the drying vessel 28 where they are dried by IPA.

The wafers W to which various washing steps have been applied are carried to the unloader 15 by the carrier means 26. Their orientation flat alignment and their housing into carriers 47 and 47' are carried out in the same manner as seen in the loader 14 and the carriers 47 and 47' in which they have been housed are carried outside the unloader 15.

In the above-described washing process, the concentration of each component in process solution L can be kept certain at all times because concentration adjustment is conducted in the APM- and DHF-contained vessels 21 and 24 by the process solution supply systems 30. The wafers W can be thus uniformly washed and the extent to which their surfaces are made clean can be kept certain at all times.

Further, the concentration of each component in process solution L can be kept certain only by supplying the new process solution L and making a part of process solution L new. It is therefore more economical as compared with the case where all of process solution must be periodically changed new one. It is only when the number of particles in process solution L reaches a predetermined value (for example, the number of the particles whose diameter is more than 0.2 μm reaches more than ten) all of process solution L must be changed new one in the present invention.

Figure 4:
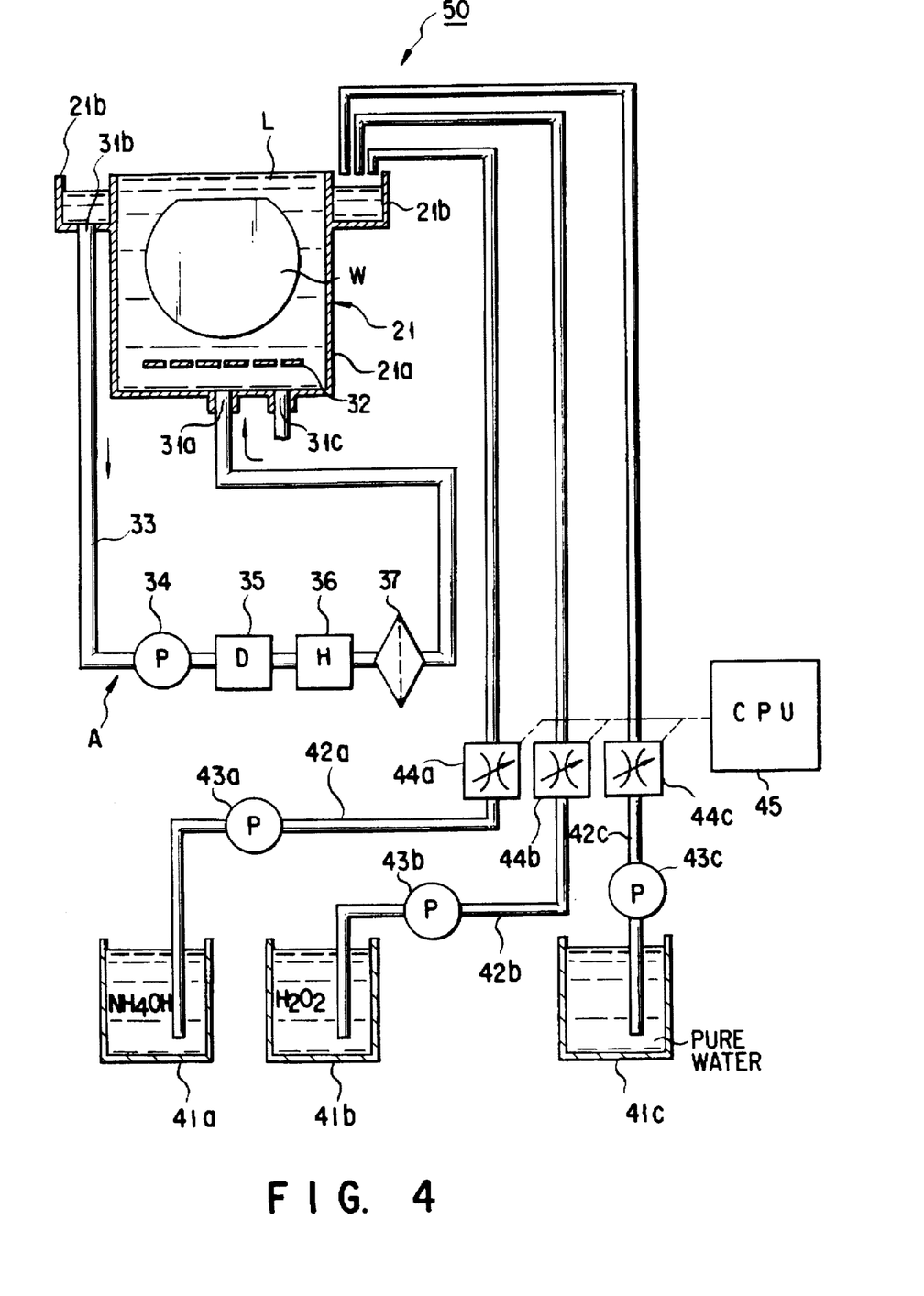
FIG. 4 is schematic illustration showing the main portion of the washing process apparatus according to a second embodiment of the present invention.

FIG. 4 shows a variation of the process solution supply system. In this process solution supply system 50, downstream ends of supply pipes 42a–42c are not connected to the circulation pipe 33, but they are positioned just above the overflow trough 21b of the process vessel 21 to supply component solutions such as aqueous ammonium, hydrogen peroxide aqueous solution or pure wafer to the trough 21b through them.

Figure 5:
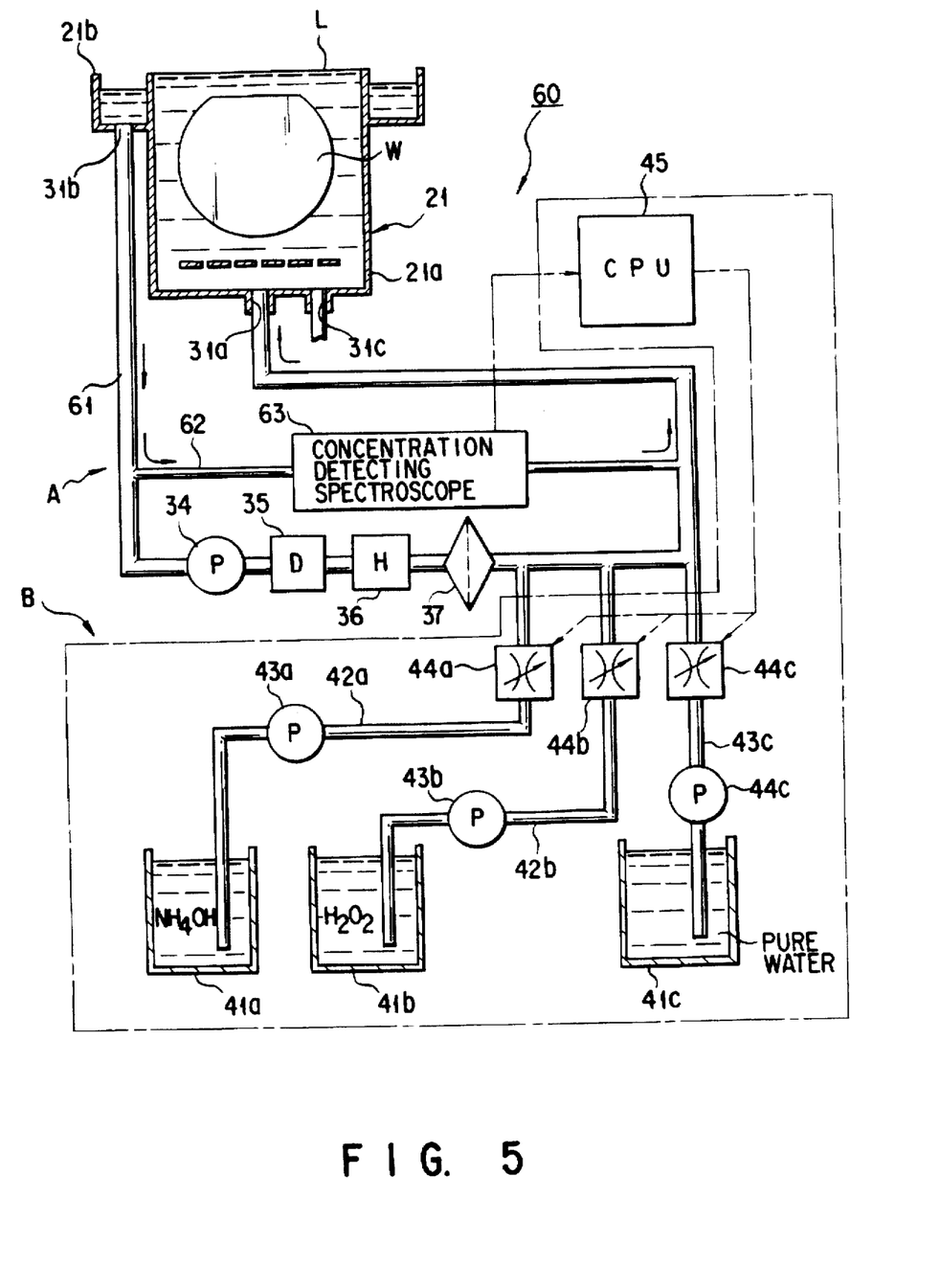
FIG. 5 is schematic illustration showing the main portion of the washing process apparatus according to a third embodiment of the present invention.

FIG. 5 shows a further process solution supply system which is provided with means for measuring the concentration of each component in process solution L. The process vessel 21 is same as the one shown in FIG. 2. The circulation line A is also same as the one in the first embodiment. One end of a circulation pipe 61 is connected to the process solution collecting opening 31b in the bottom of the overflow trough 21b of the process vessel 21. The other end thereof is connected to the process solution supply opening 31a in the bottom of the vessel body 21a. As seen in the case of the first embodiment, the circulation pump 34, the damper 35, the heat exchanger 36 and the filter 37 are attached to the circulation pipe 61 in this order when viewed from the process solution collecting opening 31b. However, a bypass pipe 62 branches from the circulation pipe 61 between the process solution collecting opening 31b and the circulation pump 34 and it again combines with the pipe 61 downstream the filter 37. A concentration detecting spectroscope 63 is attached to the bypass pipe 62.

The process solution supply lines B are same as in the case of the first embodiment. They include vessels 41a–41c in which aqueous ammonia, hydrogen peroxide aqueous solution and pure water are contained, supply pipes 42a–42c, supply pumps 43a–43c, flow rate control valves 44a–44c and the CPU 45. However, the CPU 45 is connected electrically to not only the control valves but also the spectroscope 63 to allow detection signal to be transmitted from the spectroscope 63 to the CPU 45.

According to this process solution supply system 60, a part of process solution L introduced from the overflow trough 21b of the process vessel 21 into the circulation pipe 61 through the process solution collecting opening 31b flows into the bypass pipe 62. Concentrations of components, i.e., ammonia and hydrogen peroxide, in process solution L which has flowed into the pipe 62 are detected by the spectroscope 63. The spectroscope 63 applies detection signal to the CPU 45. The measurement of component concentrations in process solution L by the spectroscope 63 is based on the principle that, when the spectrum of process solution L flowing through the bypass pipe 62 is obtained by the near infrared ray transmission spectrometry, a wavelength of this spectrum characteristic of each component in process solution L changes as the concentration of the component changes. The multicomponent concentration measurement instrument (trade name: ChemicAlyzer II by KURABO INDUSTRIES LTD.) was used in this case.

According to one of various control operational manners and responsive to detection signal applied from the spectroscope 63, the CPU 45 controls the valves 44a–44c to increase and decrease the amounts of components supplied. It conducts the PID control, for example. Relating to a reference value which denotes the concentration of each component contained and asked to be kept certain, three control constants of the proportional, integral and derivative actions are obtained from the value of detection signal which is applied from the spectroscope 63 and which change as time goes by. And one of these three constants which is the nearest to the value representing the control characteristic asked is selected.

When the concentration of each component in process solution L reduces with passage of time, therefore, the amount of the component supplied can be increased. When it becomes higher than the reference value, the amount of the component supplied can be decreased while increasing the amount of pure water supplied.

The control operational manner conducted by the CPU 45 may be based on the on/off, proportional and integral actions.

As apparent from the above, the component in process solution L which reduces with passage of time can be continuously added. The concentration of this component can be thus kept certain in process solution L. In this third embodiment, each component can be supplied by such an amount that is determined by the concentration of the component in process solution L practically measured. The third embodiment is therefore more excellent than the first one in that the concentration of each component in process solution L can be kept more accurately certain.

A measuring device such as a pH-meter or a titrator can be used instead of the concentration detecting spectroscope 63.

Figure 6:
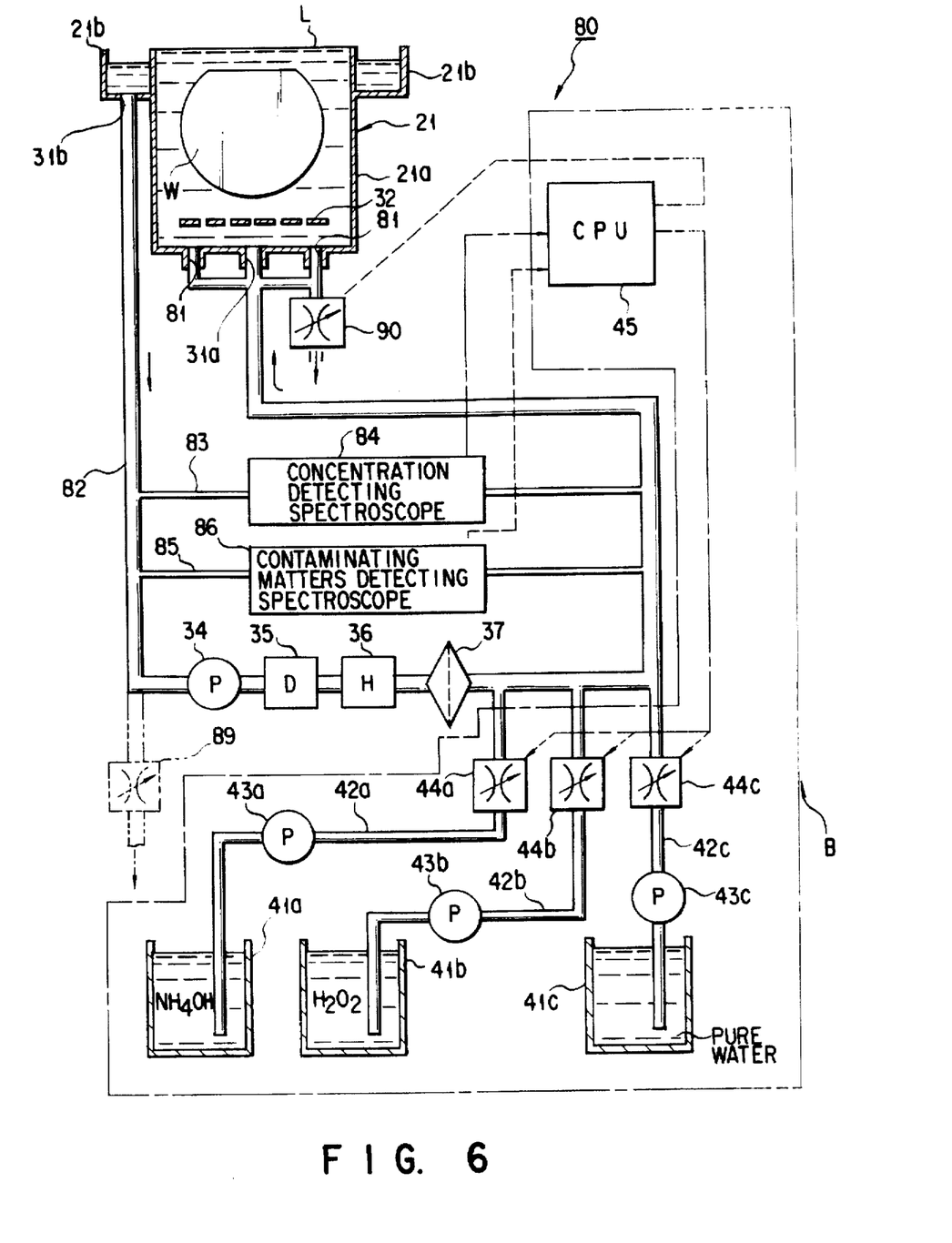
FIG. 6 is schematic illustration showing the main portion of the washing process apparatus according to a fourth embodiment of the present invention.

FIG. 6 shows a further process solution supply system 80 which is provided with means for measuring contaminating matters in process solution L. The process vessel 21 provided with this process solution supply system 80 is different from the one in the first embodiment shown in FIG. 2 in that it has two process solution exhausting openings 81 and 81' formed in the bottom of its vessel body 21a. A flow rate control valve 90 is attached to a pipe 91 extending from the exhaust openings 81 and 81'.

One end of a circulation pipe 82 is connected to the process solution collecting opening 31b in the bottom of the overflow trough 21b of the process vessel 21. The other end thereof is connected to the process solution supply opening 31a, as seen in the case of the first embodiment. The circulation pump 34, the damper 35, the heat exchanger 36 and the filter 37 are attached to the circulation pipe 82 in this order when viewed from the process solution collecting opening 31b. First and second bypass pipes 83 and 85 branch from the circulation pipe 82 between the process solution collecting opening 31b and the circulation pump 34 and they again combine with it downstream the filter 37. A concentration detecting spectroscope 84 is attached to the first bypass pipe 83.

A contaminating matters detecting spectroscope 86 is attached to the second bypass pipe 85. For example, an in-liquid particle counter RION KL-21 (trade name: KABUSHIKI GAISHA NISHIYAMA) can be used as the contaminating matters detecting spectroscope 86.

The process solution supply lines B are same as those in the first embodiment and they include vessels 41a–41c in which aqueous ammonia, hydrogen peroxide aqueous solution and pure water are contained, supply pipes 42a–42c, supply pumps 43a–43c, flow rate control valves 44a–44c and the CPU 45. The CPU 45 is electrically connected to the spectroscopes 84 and 86. Detection signals applied from these counter 84 and 86 can be thus transmitted to the CPU 45.

According to the above-described process solution supply system 80, the CPU 45 controls the valves 44a–44c to adjust the amounts of components supplied through them, depending upon concentration changes of these components detected by the particle counter 84.

A part of process solution L introduced into the circulation pipe 82 through the process solution collecting opening 31b flows into the second bypass pipe 85. The amount of contaminating matters such as particles in the process solution L flowing through the second bypass pipe 85 is detected by the spectroscope 86. Detection signal thus obtained is applied from the counter 86 to the CPU 45.

Responsive to detection signal applied from the spectroscope 86, the CPU 45 controls the valve 90 to increase or decrease the amount of process solution L exhausted through the exhaust openings 81 and 81'. For example, it compares the value of detection signal applied from the spectroscope 86 with a constant previously stored in it and controls the valve 90 on the basis of a value determined by this comparison. When the amount of process solution L exhausted increases, therefore, it controls the process solution supply valves 44a–44c to increase the total amount of components supplied so as to correspond to the increased amount of process solution exhausted. The total amount of process solution L contained in the process vessel 21 can be thus kept unchanged. Even if process solution L is exhausted to reduce the amount of contaminating matters in process solution L, therefore, the total amount of process solution L in the vessel 21 can be kept certain and the amount of contaminating matters in process solution L can also be kept as desired. According to the fourth embodiment, contaminating matters in process solution L can be reduced when process solution L is exhausted from the vessel 21. Therefore, the interval of changing the all of process solution L to new one can be made longer as compared with that in the third embodiment shown in FIG. 5.

Although two process solution exhausting openings 81 and 81' have been formed in the bottom of the vessel body 21a in this example, it may be arranged, as shown by fictitious lines in FIG. 6, that an exhaust pipe 92 branches from the circulation pipe 82 and that a valve 93 is attached to the exhaust pipe 92. When so arranged, particles floating on the surface of process solution L in the overflow trough 21b can be exhausted through the exhaust pipe 92. This enables particles in process solution to be more efficiently exhausted.

Although the washing system 10 has had three units 11, 12 and 13, as shown in FIG. 2, the present invention can also be applied to the washing system which is provided with more process units arranged like a straight line as disclosed in the specifications of U.S. patent application Ser. Nos. 08/043,731 filed at Apr. 7, 1993 and 08/138,077 filed at Oct. 20, 1993.

Although semiconductor wafers have been washed in the above-described process apparatus, LCD glass substrates, electronic parts and others can also be washed in it.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A process apparatus comprising:
   a process vessel which contains a process solution, said process solution including a volatile component and being used for processing a substrate which is immersed in the process vessel;
   supply means for supplying a contained component of the process solution to the process vessel;
   a circulating passage for extracting a part of the process solution from said process vessel, and returning it to said process vessel;
   a filter disposed in said circulating passage;
   adjusting means for adjusting an amount of said contained component supplied from said supplying means to said process vessel;
   control means for controlling said adjusting means;
   a bypass which branches from said circulating passage, at a location upstream of said filter such that said bypass bypasses said filter; and
   concentration detection means disposed in said bypass for detecting the concentration of said contained component in said process solution.

2. An apparatus according to claim 1, wherein said control means continuously controls the adjusting means, responsive to a detection signal detected by said concentration detection means, so as to supply said contained component by an amount which corresponds to a change in said concentration of said contained component in said process solution, and maintain the concentration of the contained component in said process solution in the process vessel at a predetermined value.

3. An apparatus according to claim 1, wherein said concentration detection means detects how the concentration of the volatile component of the process solution varies with elapsed time.

4. An apparatus according to claim 1, wherein said control means controls said adjusting means such that the contained component is supplied by an amount which is based on the detection signal of the concentration detection means in the case where the concentration of the volatile component becomes lower than a predetermined value which is appropriate for a process, so as to maintain the concentration of said volatile component of said process solution at a constant value.

5. An apparatus according to claim 1, wherein said concentration detection means is a transmittance spectrophotometer.

6. An apparatus according to claim 1, wherein said control means determines a supply amount of said contained component based on a numerical value calculated from a pre-memorized reference value of the concentration of the contained component in the process solution and the detection signal from the concentration detection means, by a control calculation mode.

7. An apparatus according to claim 6, wherein said control calculation mode is one selected from the group consisting of an ON/OFF operation, a proportional operation, an integration operation and a PID operation.

8. An apparatus according to claim 7, further comprising:
   another bypass which branches from the circulating passage and rejoins said circulating passage;
   contamination detection means, disposed in said another bypass, for detecting a contamination in said process solution;
   a discharge passage, which branches from said circulating passage, for discharging said process solution; and
   discharge amount adjusting means for adjusting a discharge amount of said process solution discharged via said discharge path;
   wherein said control means continuously controls said process solution, responsive to a detection signal detected by said contamination detection means so as to adjust the discharge amount of said process solution.

9. An apparatus according to claim 8, wherein said contamination detection means is a transmittance photo-spectrometer.

10. An apparatus according to claim 8, wherein said control means determines a supply amount of said contained component in accordance with a numerical value calculated from a pre-memorized reference value of the concentration of the contained component in the process solution and the detection signal from the concentration detection means, by a control calculation mode.

11. An apparatus according to claim 1, wherein said supply means includes a preserving vessel for preserving a contained component of a process solution, a supply passage running from said preserving vessel to a process vessel, and a supply pump provided disposed along said supply passage.

12. An apparatus according to claim 11, wherein said adjusting means is a supply amount adjusting valve disposed in the supply passage.

13. An apparatus according to claim 11, wherein said adjusting means is a mass-flow controller disposed along the supply passage.

14. An apparatus according to claim 11, wherein said supply pump also serves as adjusting means and the control means controls the supply pump so as to adjust the supply amount of the process solution.

15. An apparatus according to claim 1, wherein said substrate is at least one selected from the group consisting of a semiconductor wafer, an LCD glass and electronic parts.

16. An apparatus according to claim 1, wherein said control means maintains a depth of the process solution in the process vessel while the substrate is processed in the process vessel.

17. An apparatus according to claim 1, wherein said concentration detection means includes a spectrophotometer, and said spectrophotometer is able to detect a near infrared ray transmittance spectrum.

18. A process apparatus comprising:
- a process vessel which contains a process solution, said process solution containing at least ammonium and being used for processing a substrate being immersed in the process vessel;
- supply means for supplying a contained component of the process solution to the process vessel;
- a circulating passage for extracting a part of the process solution from said process vessel, and returning it to said process vessel;
- a filter disposed in said circulating passage;
- adjusting means for adjusting an amount of said contained component supplied from said supplying means to said process vessel;
- control means for controlling said adjusting means;
- a bypass which branches from said circulating passage at a location upstream of said filter such that said bypass bypasses said filter; and
- concentration detection means disposed in said bypass for detecting the concentration of said contained component in said process solution.

19. An apparatus according to claim 18, wherein said control means continuously controls the adjusting means, responsive to a detection signal detected by said concentration detection means, so as to supply said contained component by an amount which corresponds to a change in said concentration of said contained component in said process solution, and maintain the concentration of the contained component in said process solution in the process vessel, at a predetermined value.

20. An apparatus according to claim 18, wherein said concentration detection means detects how the concentration of the volatile component of the process solution, varies with elapsed time.

21. An apparatus according to claim 18, wherein said control means controls said adjusting means such that the contained component is supplied by an amount which is based on the detection signal of the concentration detection means in the case where the concentration of the volatile component becomes lower than a predetermined value which is appropriate for a process, so as to maintain the concentration of said volatile component of said process solution at a constant value.

22. An apparatus according to claim 18, wherein said concentration detection means is a transmittance spectrophotometer.

23. An apparatus according to claim 18, wherein said control means determines a supply amount of said contained component based on a numerical value calculated from a pre-memorized reference value of the concentration of the contained component in the process solution and the detection signal from the concentration detection means, by a control calculation mode.

24. An apparatus according to claim 23, wherein said control calculation mode is one selected from the group consisting of an ON/OFF operation, a proportional operation, an integration operation and a PID operation.

25. An apparatus according to claim 18, further comprising:
- another bypass which branches from the circulating passage and rejoins said circulating passage;
- contamination detection means, disposed in said another bypass, for detecting a contamination in said process solution;
- a discharge passage, which branches from said circulating passage, for discharging said process solution; and
- discharge amount adjusting means for adjusting a discharge amount of said process solution discharged via said discharge path;
- wherein said control means continuously controls said process solution, responsive to a detection signal detected by said contamination detection means so as to adjust the discharge amount of said process solution.

26. An apparatus according to claim 25, wherein said contamination detection means is a transmittance photospectrometer.

27. An apparatus according to claim 25, wherein said control means determines a supply amount of said contained component in accordance with a numerical value calculated from a pre-memorized reference value of the concentration of the contained component in the process solution and the detection signal from the concentration detection means, by a control calculation mode.

28. An apparatus according to claim 18, wherein said supply means includes a preserving vessel for preserving a contained component of a process solution, a supply passage running from said preserving vessel to a process vessel, and a supply pump disposed along said supply passage.

29. An apparatus according to claim 28, wherein said adjusting means is a supply amount adjusting valve disposed in the supply passage.

30. An apparatus according to claim 28, wherein said adjusting means is a mass-flow controller disposed along the supply passage.

31. An apparatus according to claim 28, wherein said supply pump also serves as adjusting means and the control means controls the supply pump so as to adjust the supply amount of the process solution.

32. An apparatus according to claim 18, wherein said substrate is at least one selected from the group consisting of a semiconductor wafer, an LCD glass and electronic parts.

33. An apparatus according to claim 18, wherein said control means maintains a depth of the process solution in the process vessel while the substrate is processed in the process vessel.

34. An apparatus according to claim 18, wherein said concentration detection means encloses a spectrophotometer, and said spectrophotometer is able to detect a near infrared ray transmittance spectrum.

35. A process apparatus comprising:

a process vessel which contains a process solution, said process solution including a volatile component and being used for processing a substrate which is immersed in the process vessel;

supply means for supplying a contained component of the process solution to the process vessel;

a circulating passage for extracting a part of the process solution from said process vessel, and returning it to said process vessel;

a filter disposed in said circulating passage;

adjusting means for adjusting an amount of said contained component supplied from said supplying means to said process vessel;

control means for controlling said adjusting means;

a bypass which branches from said circulating passage and which rejoins said circulating passage;

concentration detection means disposed in said bypass for detecting the concentration of said contained component in said process solution;

another bypass which branches from the circulating passage and rejoins said circulating passage;

contamination detection means, disposed in said another bypass, for detecting a contamination in said process solution;

a discharge passage, which branches from said circulating passage, for discharging said process solution; and discharge amount adjusting means for adjusting a discharge amount of said process solution discharged via said discharge path;

wherein said control means continuously controls said process solution, responsive to a detection signal detected by said contamination detection means so as to adjust the discharge amount of said process solution.

36. An apparatus according to claim 35, wherein said contamination detection means is a transmittance photo-spectrometer.

37. An apparatus according to claim 35, wherein said control means determines a supply amount of said contained component in accordance with a numerical value calculated from a pre-memorized reference value of the concentration of the contained component in the process solution and the detection signal from the concentration detection means, by a control calculation mode.

38. A process apparatus comprising:

a process vessel which contains a process solution, said process solution containing at least ammonium and being used for processing a substrate being immersed in the process vessel;

supply means for supplying a contained component of the process solution to the process vessel;

a circulating passage for extracting a part of the process solution from said process vessel, and returning it to said process vessel;

a filter disposed in said circulating passage;

adjusting means for adjusting an amount of said contained component supplied from said supplying means to said process vessel;

control means for controlling said adjusting means;

a bypass which branches from said circulating passage and which rejoins said circulating passage;

concentration detection means disposed in said bypass for detecting the concentration of said contained component in said process solution;

another bypass which branches from the circulating passage and rejoins said circulating passage;

contamination detection means, disposed in said another bypass, for detecting a contamination in said process solution;

a discharge passage, which branches from said circulating passage, for discharging said process solution; and discharge amount adjusting means for adjusting a discharge amount of said process solution discharged via said discharge path;

wherein said control means continuously controls said process solution, responsive to a detection signal detected by said contamination detection means so as to adjust the discharge amount of said process solution.

39. An apparatus according to claim 38, wherein said contamination detection means is a transmittance photo-spectrometer.

40. An apparatus according to claim 38, wherein said control means determines a supply amount of said contained component in accordance with a numerical value calculated from a pre-memorized reference value of the concentration of the contained component in the process solution and the detection signal from the concentration detection means, by a control calculation mode.

* * * * *